United States Patent
Carson et al.

(10) Patent No.: US 6,248,001 B1
(45) Date of Patent: Jun. 19, 2001

(54) SEMICONDUCTOR DIE DE-PROCESSING USING A DIE HOLDER AND CHEMICAL MECHANICAL POLISHING

(75) Inventors: Bryan C. Carson; Scott E. Moore, both of Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/369,740

(22) Filed: Aug. 6, 1999

(51) Int. Cl.[7] .................................................. B24B 1/00
(52) U.S. Cl. ............................ 451/41; 216/21; 438/4; 438/12; 438/977; 451/41; 451/287
(58) Field of Search .................... 451/41, 287; 438/4, 438/12, 977; 216/21

(56) References Cited

U.S. PATENT DOCUMENTS

| | | | |
|---|---|---|---|
| 5,626,715 | * | 5/1997 | Rostoker ................................. 438/4 |
| 5,834,840 | * | 11/1998 | Robbins ................................ 257/705 |
| 5,922,620 | * | 7/1999 | Shimomura ......................... 438/693 |
| 6,031,292 | * | 2/2000 | Murakami ............................ 257/778 |
| 6,074,287 | * | 6/2000 | Miyaji ................................... 451/287 |
| 6,074,938 | * | 6/2000 | Asamura .............................. 438/533 |
| 6,087,733 | * | 7/2000 | Maxim ................................. 257/797 |
| 6,090,239 | * | 7/2000 | Liu ....................................... 156/345 |
| 6,096,649 | * | 8/2000 | Jang ..................................... 438/687 |
| 6,103,626 | * | 8/2000 | Kim ...................................... 438/691 |
| 6,114,206 | * | 9/2000 | Yu ........................................ 438/270 |
| 6,159,759 | * | 12/2000 | Shao ...................................... 438/30 |
| 6,165,692 | * | 12/2000 | Kanai ................................... 430/311 |
| 6,171,982 | * | 1/2001 | Sato ..................................... 438/795 |

\* cited by examiner

*Primary Examiner*—Gregory L. Huson
*Assistant Examiner*—Paul D. Kim

(57) ABSTRACT

A method and apparatus for removing layers from a circuit side of a semiconductor die includes the use of a holder, for example a semiconductor wafer having an opening therein for receiving the semiconductor die. Additionally the holder can include one or more layers thereover which are removed at a similar rate as those layers which comprise the semiconductor die. A die is placed into the opening and a circuit side of the die is aligned with a front side of the holder, for example using a generally planar surface, and is secured to the holder with an adhesive material. Using a holder reduces uneven layer removal which is known to occur in conventional processing, for example excessive removal at the edges of the die. A potting jig which aids in aligning and securing the die to the holder is also described.

26 Claims, 3 Drawing Sheets

SEMICONDUCTOR DIE DE-PROCESSING USING A DIE HOLDER AND CHEMICAL MECHANICAL POLISHING

FIELD OF THE INVENTION

This invention relates to the field of semiconductor devices, and more particularly to a method and apparatus for removing one or more layers from a semiconductor die or wafer section.

BACKGROUND OF THE INVENTION

In the field of semiconductor manufacture there is often a need to de-process a semiconductor die by removing layers, which can be from several thousand angstroms (Å) thick to less than 100 Å thick, one at a time from the surface of the die. For example, de-processing a die aids in determining device failure mechanisms and is also useful in determining patent infringement of a competitor's part.

Current methods of die de-processing include removal of layers using a portable hand polisher such as those available from Buehler of Lake Bluff, Ill. and Allied of Rancho Dominguez, Calif. To use these polishers for die de-processing, the back (noncircuit side) of a semiconductor die is adhered to a generally planar support such as a "puck" with an adhesive such as pine tar. An abrasive pad, for example a material comprising a diamond lapping film, is mounted to a planar platen of the polisher. The polisher is activated and the abrasive pad is contacted with the circuit side of the die to remove layers therefrom.

Various problems result from this method of die de-processing. For example the leading edge of the die which first contacts the abrasive pad is removed at a faster rate than the remainder of the die. This results in more difficult data analysis than if the surface of the die is removed more uniformly.

Another de-processing method includes the removal of layers with an acid, but this method suffers from lack of control in chemical migration from one metal layer to another. Further, acid etches are not planar as various materials are etched at varying rates.

A method and structure for de-processing a semiconductor die which reduces or eliminates the problems described above would be desirable.

SUMMARY OF THE INVENTION

The present invention provides a new apparatus and method which reduces problems associated with the de-processing and analysis of semiconductor devices, particularly problems resulting from uneven removal of layers from the circuit side of a device. In accordance with one embodiment of the invention a semiconductor wafer having a die-shaped opening therein, and optionally having one or more layers to be polished or removed, is provided. The circuit side of the die and a generally planar first side of the wafer are aligned, for example by placing the die and the wafer on a flat surface. The die is secured to the wafer with an adhesive and any excess adhesive on the back of the die-wafer assembly is removed, either before or after the adhesive cures. Subsequently, portions of the circuit side of the die-wafer assembly are removed using mechanical planarization techniques, such as chemical mechanical polishing techniques.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
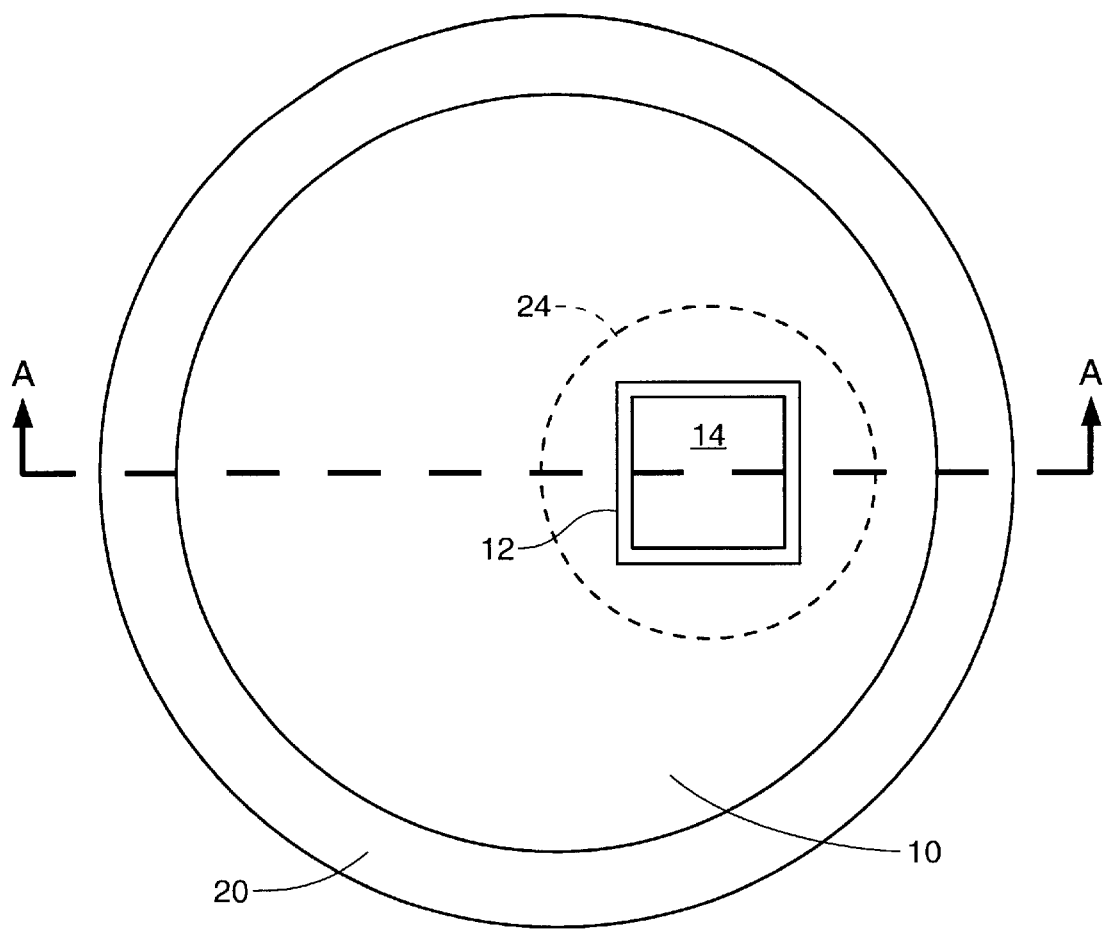
FIG. 1 is a top view of an inventive holder having a semiconductor die secured thereto.

FIG. 1 is a top view of a first embodiment of the invention. FIG. 1 depicts a die holder 10 which comprises a conventional semiconductor wafer (a "dummy" wafer) having a die-shaped aperture or opening 12 formed therein. The opening can be formed by laser cutting, chemically etching, or by mechanically cutting the wafer. Generally, the opening will be from about one mil to about 20 mils larger in both X- and Y-directions than the die 14 which is to be inserted therein. The location of the opening is preferably optimized for even removal of layers overlying the die, and will generally be located away from the center of the holder. A front side of the holder can further comprise a layer of material such as dielectric (not depicted in FIG. 1) as described below formed thereover by means known in the art.

Figure 2:
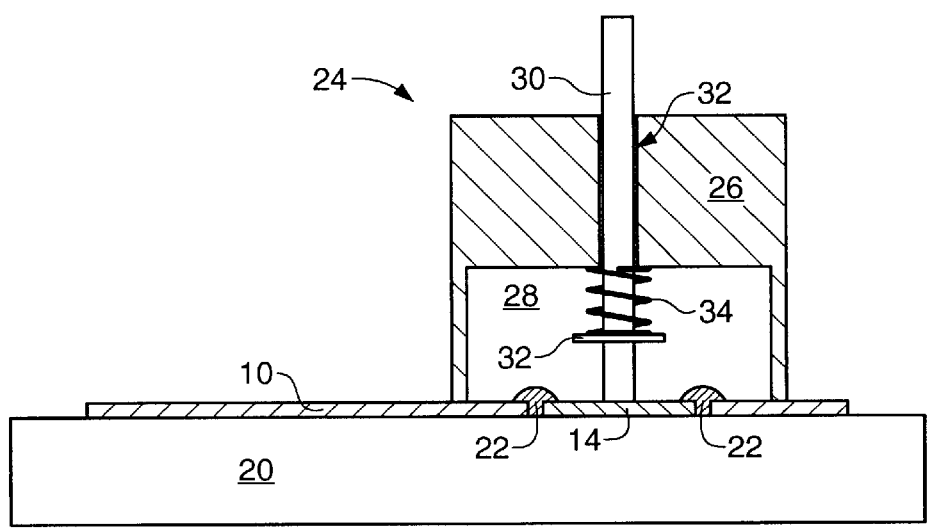
FIG. 2 is a cross section of a first embodiment of the invention.

The front side of the holder is placed on a flat mounting surface such as an optical flat 20 as depicted in FIG. 2. Optical flats, such as those manufactured from quartz, are known in the art and comprise a planar surface. Other generally flat mounting surfaces would be adequate as long as the wafer section and the holder can be aligned in generally coplanar relation without damage to the wafer section in a manner sufficient to facilitate die de-processing. A die 14 or other wafer section to be de-processed is placed within the opening with its circuit side contacting the optical flat. The flat aligns the front side of the holder with the circuit side of the die such that the two surfaces are generally coplanar.

Subsequently, an adhesive 22 is dispensed within the space between the holder 10 and the die 14 to fill the space. Epoxy adhesives such as Devcon 2-part 24 hour epoxy would function sufficiently. The adhesive can be applied in any sufficient manner such as by syringe dispensing, screen printing, or spraying. In the assembly depicted in FIG. 1, the adhesive is dispensed around four sides comprising a perimeter of the die into a space between the die and the holder.

A potting jig 24 such as that depicted in FIG. 2 may aid in aligning and securing the die 14 to the holder 10. The potting jig 24 comprises a generally circular or square block 26, for example manufactured from steel, having a recess 28 therein, a shaft 30, and a hole 32 in the block 26 for receiving the shaft 30. The shaft has a ring 32 affixed thereto, and a spring 34 is placed in recess 28 between the block 26 and the ring 32 such that the spring 34 urges the shaft 30 toward the die 14. During use, the die 14 and holder 10 are placed on the optical flat 20 then the jig 24 is placed on the holder 10. As the holder depicted is held in position by gravity it must be of sufficient mass to maintain the position of the holder against the optical flat. The shaft 30 applies downward pressure to the die 14 and holds the die in position. The die can be released from contact with the shaft by lifting on the end of the shaft which protrudes from the block as depicted in FIG. 2. The die can be manually positioned through an access hole in the side of the mount so that the die is generally aligned within the opening in the holder. A syringe can be used to dispense the adhesive 22 (or potting material) around the perimeter of the die to fill the space between the die 14 and the holder 10.

After dispensing the adhesive it is cured and any excess material on the back of the die-holder assembly, such as the bead of adhesive depicted in FIG. 2, is removed, for example by backgrinding the assembly.

Once the adhesive is cured the die-holder assembly is removed from the optical flat and background if necessary, then die de-processing is initiated. The various layers on the circuit side of the die can be removed using chemical mechanical polishing (CMP) techniques to polish one or more layers from the die surface. CMP techniques are well known in the art and comprise the use of a slurry having both a chemical component which chemically reacts with overlying layers and fixed abrasives to mechanically remove overlying layers. The slurry therefore comprises one or more active chemical components and one or more inert abrasive chemistries. As the edges of the die are generally coplanar with the front surface of the holder the entire surface of the die is removed at generally the same rate. This is in contrast to conventional techniques discussed above in which the edges of the die (and specifically the leading edge of the die) are removed at a faster rate than the central region of the die.

Preferably, an adhesive is selected which will be removed during subsequent steps at about the same rate as layers overlying the die. However, most adhesives used as potting material will be removed at a somewhat faster rate than the removal of layers from the circuit side of the die. This will not significantly impact the even removal of layers from the circuit side of the die. Further, the adhesive which is removed will mix with the CMP slurry but does not adversely affect the removal of the layer overlying the die.

Figure 3:
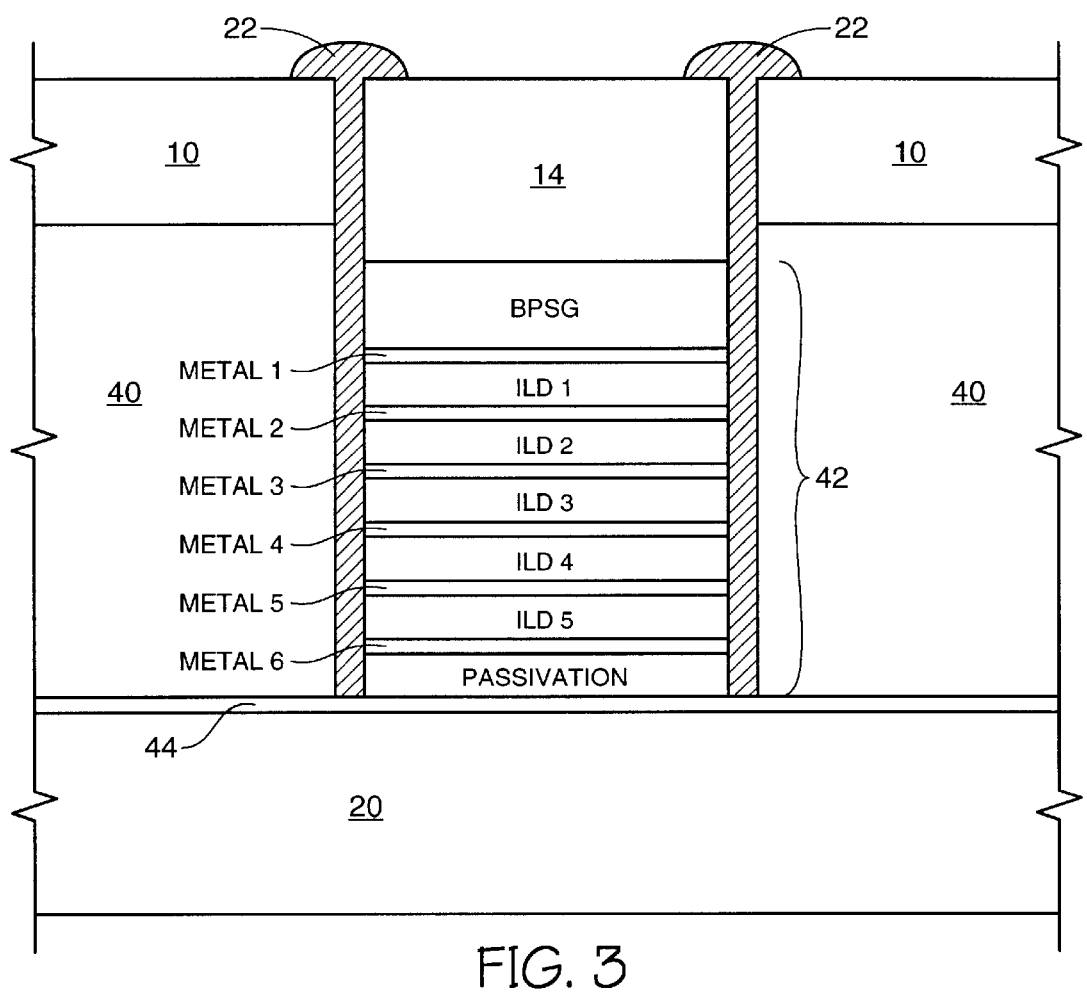
FIG. 3 is a cross section of the area surrounding the die of one embodiment of the invention.

To aid in the even removal of layers from the circuit side of the die, one or more layers 40 can be formed over the front of the holder 10 as depicted in FIG. 3, preferably prior to forming the opening 12 in the holder 10. For example, a layer of oxide such as borophosphosilicate glass (BPSG) or tetraethyl orthosilicate (TEOS) can be formed over the holder. Thus the layer over the front of the holder will be removed at the same time and preferably at the same rate as the layers 42 over the circuit side of the die 14 and may provide a more uniform die de-processing procedure.

Additionally, depending on the adhesive used to secure the die within the holder, it may be useful to provide a coating of an adhesive release layer 44 between the optical flat 20 and the die-holder assembly as depicted in FIG. 3. Preferably, the release layer 44 is dispensed on the optical flat prior to its contact with the holder. The coating can include polyimide, Teflon®, general purpose mold release, or Dow Corning 200, for example having a viscosity of 100,000 centipoise (cP). Such a coating will reduce the likelihood of the cured adhesive adhering to the optical flat which may result in damage to the die or to the holder as they are removed from the optical flat.

A die will generally be polished to remove a layer and then will be inspected, then repolished to remove another layer. This process will continue until analysis is completed.

Figure 4:
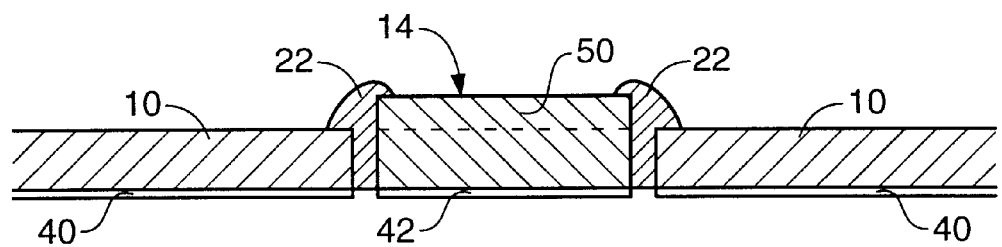
FIG. 4 is a cross section depicting an arrangement having a wafer section which is thicker than the holder.

Various other modifications to the invention may be required or desirable depending on the arrangement of the wafer section and the holder. For example, FIG. 4 depicts an arrangement wherein the wafer section 14 is thicker than the holder 10. The excess portion 50 of the wafer section extending above the level of the back of the holder can easily be ground off using conventional backgrinding techniques if necessary to provide a generally planar surface across the back of the holder-wafer section assembly.

Figure 5:
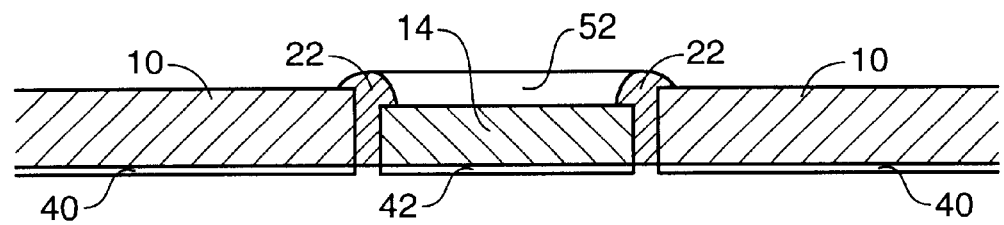
FIG. 5 is a cross section depicting an assembly wherein the wafer section is thinner than the holder.

FIG. 5 depicts an arrangement wherein the wafer section 14 is thinner than the holder 10. With this assembly, the potting material 22 can be provided as described above, then additional fill material 52 can be dispensed across the back of the wafer section, cured, then ground off using conventional backgrinding techniques to provide a planar back surface. Alternately, the uncured fill material can be dispensed and formed before it is cured such that it is planar after the fill material is cured such that a backgrinding step is not required.

Figure 6:
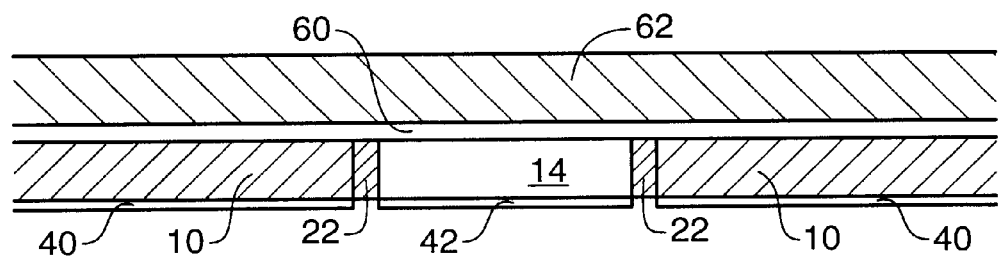
FIG. 6 is a cross section depicting an assembly having a backing on the wafer section-holder assembly.

FIG. 6 depicts another assembly in which the potting material 22 is applied to the holder, cured, and ground. An adhesive 60, such as an epoxy or methacrylate adhesive, is applied to the back of the holder-wafer section assembly and a backing 62, such as an additional semiconductor wafer, is adhered to the back of the assembly. The backing can be advantageous where backgrinding or other factors, such as a thin holder and wafer section for thin small outline packages (TSOP), has left the wafer section-holder assembly thin and fragile thereby increasing the likelihood of damage to the assembly. Further, an excessively thin assembly may not be adequately held by the carrier of the polishing apparatus. The backing provides additional support and thickness.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, two or more singularized or unsingularized semiconductor die can be de-processed simultaneously. Further, holders manufactured from other materials may be sufficient, although a semiconductor wafer is preferable. Also, instead of the jig described other alignment fixtures can be used to temporarily hold the wafer section in alignment with the holder while the adhesive or potting material is applied. Such alignment fixtures include a vacuum supplied to the die through a hole in the holder, an adhesive material such as an adhesive polymer of the type used to secure semiconductor die during a wafer sawing process, or by various clamps. It is therefore contemplated that the appended claims will cover any such modifications or embodiments as fall within the true scope of the invention.

What is claimed is:

1. A method used to de-process a semiconductor device comprising the following steps:

providing a semiconductor wafer section;

providing a holder having an opening therein;

placing said semiconductor wafer section into said opening and generally aligning a first side of said wafer section with a first side of said holder;

securing said wafer section in generally fixed relation to said holder; and subsequent to securing said wafer section to said holder, removing a portion of said first side of said wafer section.

2. The method of claim 1 wherein said step of providing said holder comprises the step of providing a semiconductor wafer having at least one layer formed thereover, and said method further comprises the step of polishing said at least one layer formed over said wafer during said step of polishing said first side of said wafer section.

3. The method of claim 1 wherein said step of securing said wafer section to said holder comprises the steps of:

dispensing a potting material between said wafer section and said holder;

curing said potting material; and subsequent to said step of curing said potting material, back grinding said wafer section and said holder to remove excess cured potting material.

4. The method of claim 1 wherein said step of placing said semiconductor wafer section into said opening includes the step of contacting said first side of said wafer section and said first side of said holder with a generally planar alignment surface, and aligning said first side of said wafer section with said first side of said holder.

5. The method of claim 4 wherein said generally planar alignment surface comprises an adhesive release layer and said step of contacting wafer section and said holder with said alignment surface includes contacting said wafer section and said holder with said release layer.

6. A method for removing a layer from a semiconductor device comprising the following steps:

providing a semiconductor wafer having a generally planar front side and a die-shaped opening therein;

providing a semiconductor die having a generally planar surface;

placing said die into said opening in said wafer;

securing said die to said wafer; and subsequent to said step of securing said die to said wafer, polishing said generally planar surface of said die.

7. The method of claim 6 wherein said polishing step comprises removing at least one layer from said generally planar surface of said die.

8. The method of claim 7 wherein said semiconductor wafer comprises at least one layer formed thereover and said polishing step comprises removing at least a portion of said at least one layer from said wafer.

9. The method of claim 6 wherein said step of providing said wafer comprises providing a wafer having said die-shaped opening, said opening comprising a length and a width, wherein said length is between about 1 and about 20 mils greater than a length of said die and said width is between about 1 and about 20 mils greater than a width of said die.

10. The method of claim 6 wherein said step of securing said die to said wafer comprises the step of dispensing a potting material around a perimeter of said die into a space between said die and said wafer.

11. The method of claim 10 further comprising the following steps:

providing an optical flat; and positioning said wafer on said optical flat, then performing said step of placing said die into said opening in said wafer, wherein said optical flat aligns said generally planar front side of said wafer with said generally planar surface of said die.

12. The method of claim 11 further comprising the step of applying an adhesive release layer to said optical flat prior to said step of positioning said wafer on said optical flat.

13. The method of claim 6 wherein said polishing step further comprises the step of using chemical mechanical polishing.

14. The method of claim 6 wherein said generally planar surface of said die is a circuit side of said die.

15. A method of removing material from a first face of a semiconductor die, comprising the steps of:

securing a semiconductor die to a support member, said support member having an exposed face removable at a rate proximate to a rate at which material will be removed from said die when subjected to chemical mechanical polishing; and performing chemical mechanical polishing on said die and said support member sufficiently to remove an amount of material from said die.

16. The method of claim 15 further comprising the step of securing said die with said first face in generally coplanar relation with said exposed face of said support member.

17. The method of claim 15 wherein said support member has an aperture therein, and said method further comprises the step of securing said die to said support member within said aperture.

18. The method of claim 15 wherein said support member comprises at least one dielectric layer and said method further comprises the step of removing an amount of said dielectric layer during said step of performing chemical mechanical polishing on said die and said support member.

19. The method of claim 15 wherein said step of securing said die to said support member includes the step of providing an adhesive between said die and said support member.

20. The method of claim 19 further comprising the steps of:

curing said adhesive; and subsequent to curing said adhesive, backgrinding said adhesive from said support member.

21. A method used during the de-processing of a semiconductor die comprising the following steps:

providing a semiconductor wafer having a layer of material thereover and an opening therein;

providing a semiconductor die having a layer of material thereover;

placing said die into said opening;

subsequent to said step of placing said die into said opening, aligning said die and said wafer;

subsequent to said step of aligning said die and said wafer, securing said die to said wafer;

subsequent to said step of securing said die to said wafer, removing at least a portion of said layer of material over said die; and subsequent to said step of removing said material from over said die, inspecting said die.

22. The method of claim 21 further comprising the step of applying an epoxy adhesive to said die and to said wafer during said step of securing said die to said wafer.

23. The method of claim 22 further comprising the step of backgrinding a portion of said epoxy adhesive subsequent to said step of securing said die to said wafer.

24. The method of claim 21 further comprising the method of backgrinding a portion of said die subsequent to said step of securing said die to said wafer.

25. The method of claim 21 wherein said step of providing said wafer comprises the following steps:

forming a plurality of layers over a front of a semiconductor wafer; then removing a portion of said semiconductor wafer to form said opening therein.

26. The method of claim 25 wherein said step of removing a portion of said wafer removes a portion of said wafer at a location away from a center of said wafer.

* * * * *